(12) United States Patent
Inoue et al.

(10) Patent No.: US 11,881,832 B2
(45) Date of Patent: Jan. 23, 2024

(54) FILTER AND MULTIPLEXER

(71) Applicant: TAIYO YUDEN CO., LTD., Tokyo (JP)

(72) Inventors: Makoto Inoue, Tokyo (JP); Jaeho Jeong, Tokyo (JP); Hideyuki Sekine, Tokyo (JP); Naoto Kobayashi, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 17/847,522

(22) Filed: Jun. 23, 2022

(65) Prior Publication Data
US 2022/0416746 A1 Dec. 29, 2022

(30) Foreign Application Priority Data
Jun. 24, 2021 (JP) ................. 2021-104674

(51) Int. Cl.
*H03H 7/01* (2006.01)
*H03H 7/46* (2006.01)
*H03H 1/00* (2006.01)

(52) U.S. Cl.
CPC ............ *H03H 7/0115* (2013.01); *H03H 7/46* (2013.01); *H03H 2001/0085* (2013.01)

(58) Field of Classification Search
CPC . H03H 2001/0085; H03H 7/0115; H03H 7/46
USPC .................................................. 333/175, 185
See application file for complete search history.

(56) References Cited

U.S. PATENT DOCUMENTS

2003/0076199 A1\* 4/2003 Yamaguchi ......... H01P 1/20381
333/175
2018/0226952 A1 8/2018 Tanaka et al.

FOREIGN PATENT DOCUMENTS

JP 2018-129683 A 8/2018

\* cited by examiner

*Primary Examiner* — Rakesh B Patel
(74) *Attorney, Agent, or Firm* — CHEN YOSHIMURA LLP

(57) ABSTRACT

A filter includes an input terminal, an output terminal, a first ground terminal, a second ground terminal, a first inductor having a first end coupled to a first node in a path between the input terminal and the output terminal and a second end coupled to a second node, a second inductor having a first end coupled to the second node and a second end coupled to the first ground terminal, and a third inductor having a first end coupled to the second node and a second end coupled to the second ground terminal.

15 Claims, 16 Drawing Sheets

FILTER AND MULTIPLEXER

FIELD

A certain aspect of the present disclosure relates to a filter and a multiplexer.

BACKGROUND

A filter in which an inductor is shunt-connected to a path between the input terminal and the output terminal is known as disclosed in Japanese Patent Application Publication No. 2018-129683.

RELATED ART DOCUMENTS

Patent Documents

Japanese Patent Application Publication No. 2018-129683

SUMMARY

When the filter is mounted on a substrate such as a circuit board or an evaluation board, a parasitic inductance is generated between the ground terminal of the filter and the substrate. Depending on the methods of mounting the filter on the substrate, the parasitic inductance differs. This results in different filter characteristics depending on the mounting methods.

The present disclosure has been made in view of above problems, and has an objective of stabilizing filter characteristics.

The present disclosure provides, in one aspect, a filter including: an input terminal; an output terminal; a first ground terminal; a second ground terminal; a first inductor having a first end coupled to a first node in a path between the input terminal and the output terminal and a second end coupled to a second node; a second inductor having a first end coupled to the second node and a second end coupled to the first ground terminal; and a third inductor having a first end coupled to the second node and a second end coupled to the second ground terminal.

The above filter may be a high-pass filter having a passband, and may include a resonant circuit that includes the first inductor, the second inductor, and the third inductor, and forms a local minimum of an attenuation pole at a frequency lower than the passband.

The above filter may further include: a first capacitor and a second capacitor that are connected in series between the input terminal and the output terminal; and a capacitive element that is connected in parallel to the first capacitor and the second capacitor between the input terminal and the output terminal, and the first node may be a node between the first capacitor and the second capacitor, and may be coupled to the capacitive element through the first capacitor and the second capacitor.

The above filter may be a high-pass filter having a passband, and the first inductor, the second inductor, the third inductor, the first capacitor, the second capacitor, and the capacitive element may form a first local minimum of a first attenuation pole at a frequency lower than the passband.

In the above filter, the capacitive element may be an acoustic wave resonator, and the acoustic wave resonator may form a second local minimum of a second attenuation pole between the first local minimum and the passband.

The above filter may further include: a first capacitor and a second capacitor that are connected in series between the input terminal and the output terminal; and a third capacitor connected in series with the first inductor between the first node and the second node.

In the above filter, a smaller of inductances of the second and third inductors may be equal to or greater than 0.1 times a larger of the inductances of the second and third inductors.

In the above filter, an inductance of the first inductor may be greater than a larger of inductances of the second and third inductors.

The above filter may further include: a third ground terminal; and a fourth inductor having a first end coupled to the second node and a second end coupled to the third ground terminal.

In the above filter, the first inductor, the second inductor, and the third inductor may be formed in a multilayered body in which dielectric layers are stacked, and the first ground terminal and the second ground terminal may be formed on the same surface of the multilayered body.

The present disclosure provides, in another aspect, a multiplexer including the above filter.

DETAILED DESCRIPTION

Hereinafter, a description will be given of embodiments of the present disclosure with reference to the accompanying drawings.

First Embodiment

Figure 1:
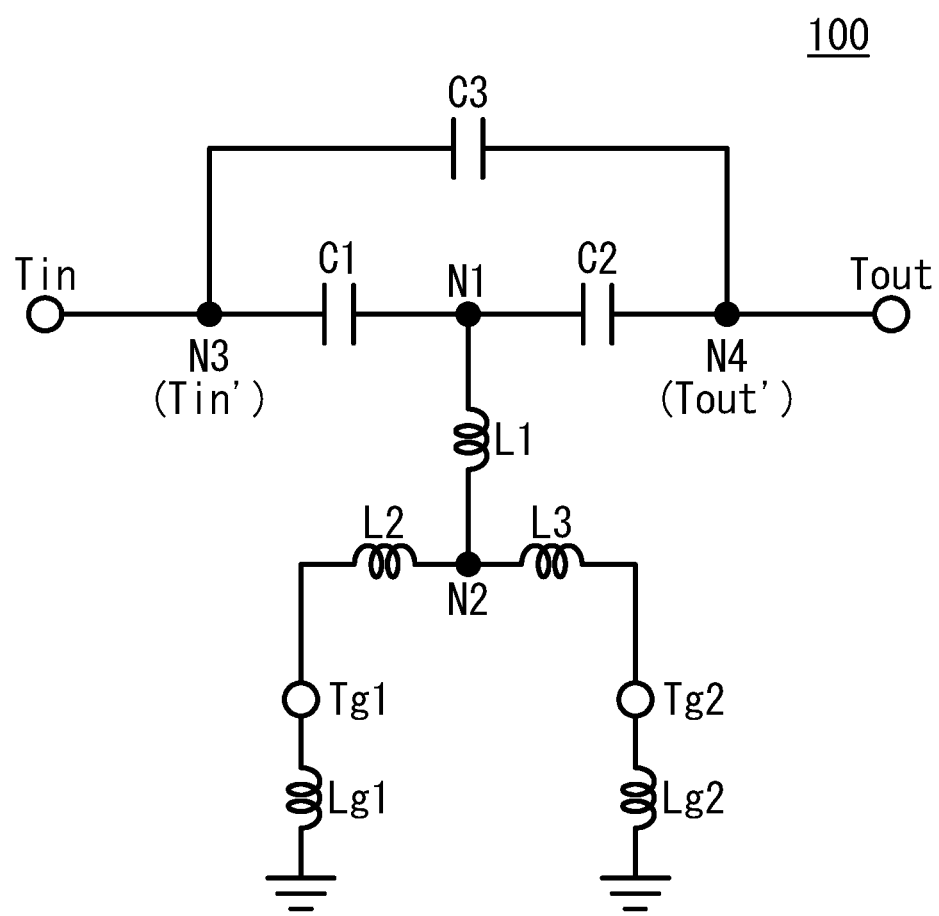
FIG. 1 is a circuit diagram of a filter in accordance with a first embodiment.

A first embodiment is an exemplary high-pass filter. FIG. 1 is a circuit diagram of a filter in accordance with the first embodiment.

As illustrated in FIG. 1, in a filter 100 in accordance with the first embodiment, capacitors C1 and C2 are connected in series between an input terminal Tin and an output terminal Tout. Between the input terminal Tin and the output terminal Tout, a capacitor C3 is connected in parallel to the capacitors C1 and C2. A node between the capacitors C1 and C2 is a node N1. A node to which the capacitors C1 and C3 are coupled is a node N3. A node to which the capacitors C2 and C3 are coupled is a node N4. There are only two paths connecting the node N1 and the capacitor C3, which are the path from the node N1 to the capacitor C3 through the capacitor C1 and the path from the node N1 to the capacitor C3 through the capacitor C2. That is, the node N1 is not connected to the capacitor C3 without the capacitors C1 and C2.

An inductor L1 is shunt-connected to the path between the input terminal Tin and the output terminal Tout. A first end of the inductor L1 is coupled to the node N1, and a second end of the inductor L1 is coupled to the node N2. A first end of an inductor L2 is coupled to the node N2, and a second end of the inductor L2 is coupled to a ground terminal Tg1. A first end of an inductor L3 is coupled to the node N2, and a second end of the inductor L3 is coupled to a ground terminal Tg2. The ground terminal Tg1 is coupled to a ground through a parasitic inductance Lg1, and the ground terminal Tg2 is coupled to a ground through a parasitic inductance Lg2. The filter 100 transmits signals in the passband to the output terminal Tout among high-frequency signals input to the input terminal Tin, and suppresses signals with other frequencies.

Figure 2:
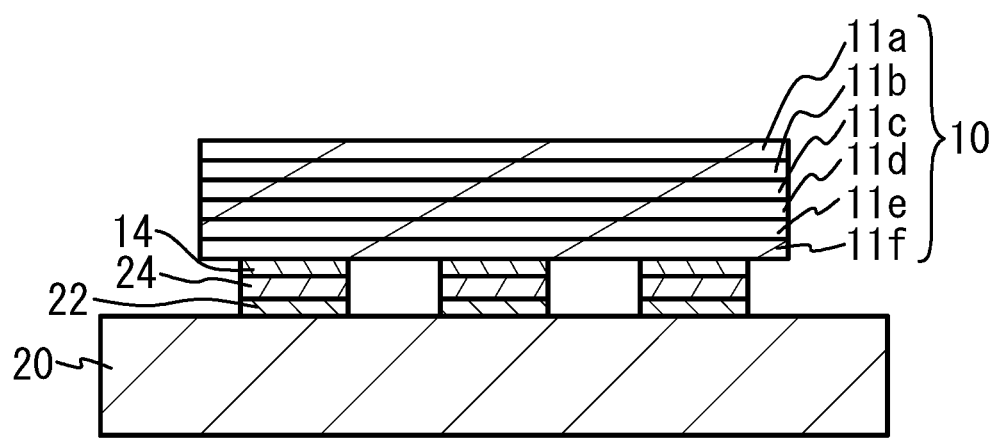
FIG. 2 is a cross-sectional view illustrating a multilayered body in the first embodiment mounted on a substrate.

FIG. 2 is a cross-sectional view illustrating a multilayered body in the first embodiment mounted on a substrate. As illustrated in FIG. 2, a multilayered body 10 includes dielectric layers 11a to 11f. Terminals 14 are disposed on the bottom surface of the multilayered body 10. Terminals 22 are disposed on a substrate 20. The terminal 14 is bonded to the terminal 22 by a bonding material 24. The substrate 20 is, for example, a circuit board or an inspection board. The inspection board is a substrate used in inspecting at least a part of the filter 100 formed in the multilayered body 10. When at least a part of the filter 100 is inspected, a conductive sheet is used as the bonding material 24, for example. When the multilayered body 10 is mounted on the substrate 20, solder is used as the bonding material 24, for example. The path from the terminal 14 to the terminal 22 through the bonding material 24 forms the parasitic inductances Lg1 and Lg2.

Figure 3A:
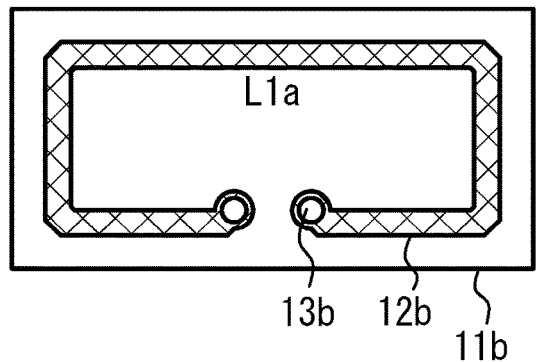
FIG. 3A to FIG. 3F are plan views of dielectric layers in the first embodiment.
Figure 3D:
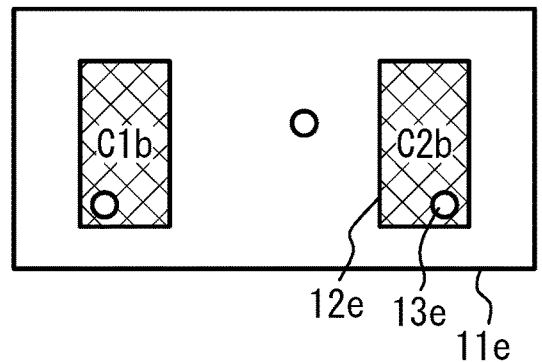
Figure 3B:
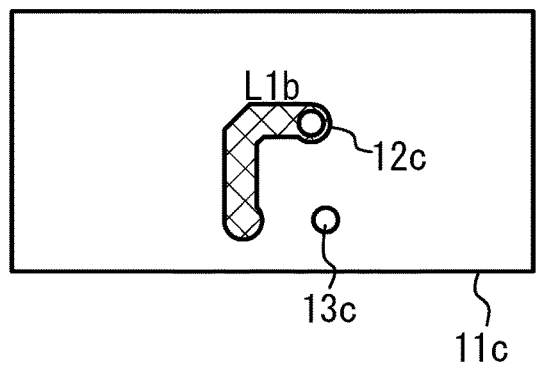
Figure 3E:
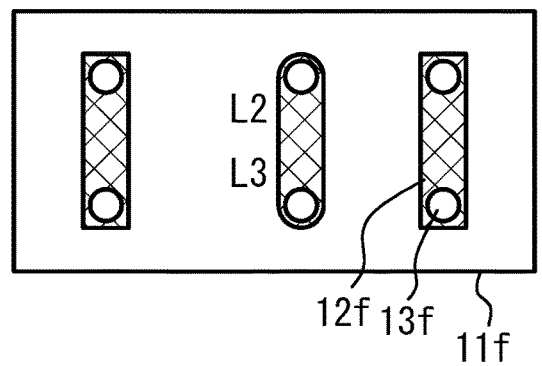
Figure 3C:
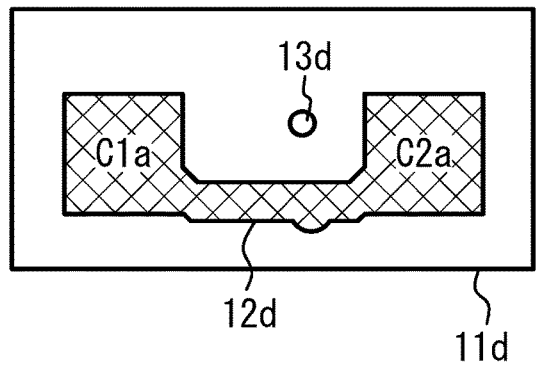
Figure 3F:
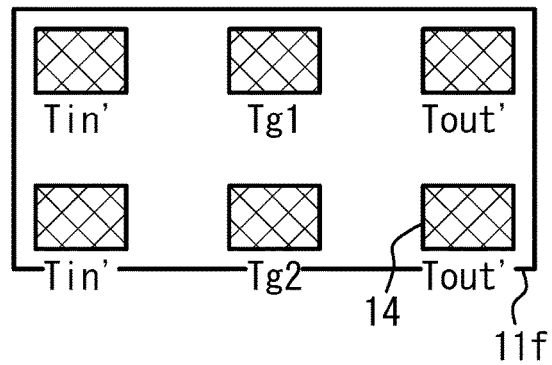

FIG. 3A to FIG. 3F are plan views of the dielectric layers in the first embodiment. FIG. 3A to FIG. 3E are plan views of dielectric layers 11b to 11f as viewed from above, respectively. FIG. 3F is a plan view of the terminals 14 through the dielectric layer 11f. The dielectric layer 11a is not illustrated.

As illustrated in FIG. 3A to FIG. 3F, conductive patterns 12b to 12f are provided on the dielectric layers 11b to 11f, respectively, and via-wiring lines 13b to 13f penetrating through the dielectric layers 11b to 11f, respectively, are provided. As illustrated in FIG. 3A, the conductive pattern 12b provided on the dielectric layer 11b forms a line L1a. As illustrated in FIG. 3B, the conductive pattern 12c provided on the dielectric layer 11c forms a line L1b. The lines L1a and L1b are electrically connected by the via-wiring line 13b to form the inductor L1.

As illustrated in FIG. 3C, the conductive pattern 12d provided on the dielectric layer 11d forms respective upper electrodes C1a and C2a of the capacitors C1 and C2. As illustrated in FIG. 3D, the conductive pattern 12e provided on the dielectric layer 11e forms respective lower electrodes C1b and C2b of the capacitors C1 and C2. The dielectric layer 11d and the electrodes C1a and C1b that sandwich the dielectric layer 11d therebetween form the capacitor C1, while the dielectric layer 11d and the electrodes C2a and C2b that sandwich the dielectric layer 11d therebetween form the capacitor C2.

As illustrated in FIG. 3E, the conductive pattern 12f provided on the dielectric layer 11f forms the inductors L2 and L3. As illustrated in FIG. 3F, the terminals 14 disposed on the bottom surface of the dielectric layer 11f form an input terminal Tin', an output terminal Tout', and the ground terminals Tg1 and Tg2. The capacitor C3 is not provided in the multilayered body 10, and the input terminal Tin' and the output terminal Tout' correspond to the node N3 and N4 in FIG. 1, respectively. The capacitor C3 may be mounted on, for example, the substrate 20 of FIG. 2, or may be mounted on the multilayered body 10. The capacitor C3 may be provided in the multilayered body 10.

The dielectric layers 11a to 11f are composed of, for example, a ceramic material, and contain an oxide containing, for example, Si, Ca, and Mg (e.g., $CaMgSi_2O_6$ that is a diopside crystal) as the main component. The main component of the dielectric layers 11a to 11j may be an oxide other than an oxide containing Si, Ca, and/or Mg. Further, the dielectric layers 11a to 11j may contain an oxide containing at least one of Ti, Zr, and Al as an insulating material. The dielectric layers 11a to 11f may be composed a resin such as a glass epoxy resin, or ceramics such as low temperature co-fired ceramics (LTCC) or high temperature co-fired ceramics (HTCC). The conductive patterns 12b to 12f, upper portions of the via-wiring lines 13b to 13f, and upper portions of the terminals 14 are formed of non-magnetism metal layers mainly composed of, for example, Ag, Pd, Pt, Cu, Ni, Au, an Au—Pd alloy, or an Ag—Pt alloy. The upper portion of the terminal 14 may contain a non-conducted material such as $TiO_2$, $ZrO_2$, or $Al_2O_3$, in addition to the above metal material. The lower portion of the terminal 14 is formed of a Ni film and a Sn film.

First Comparative Example

Figure 4:
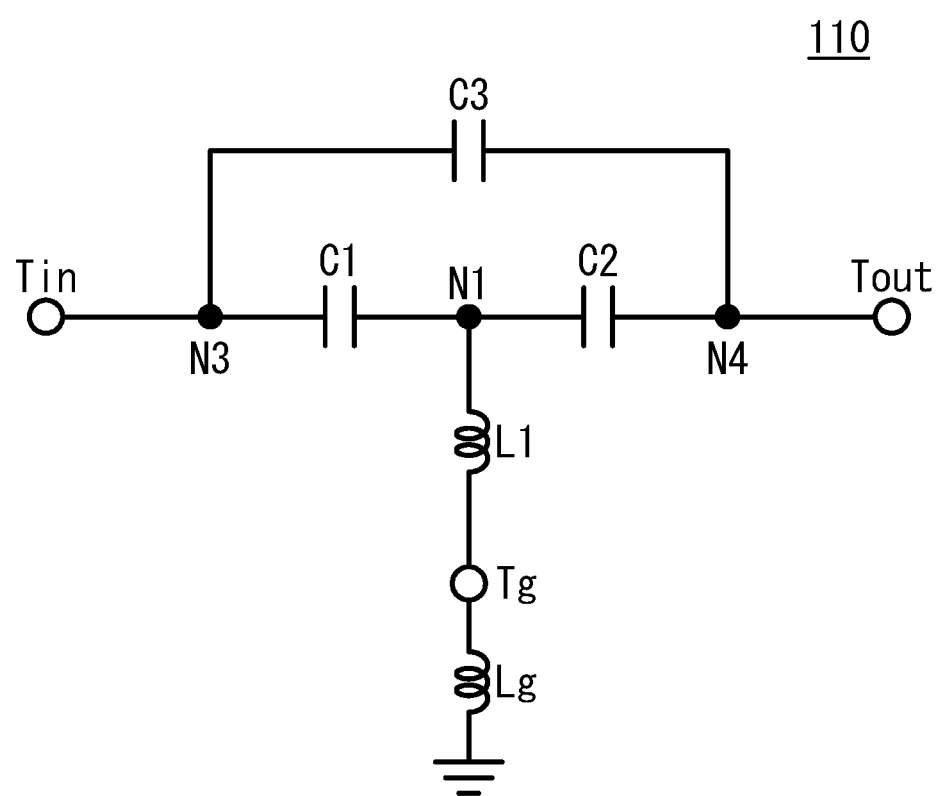
FIG. 4 is a circuit diagram of a filter in accordance with a first comparative example.

FIG. 4 is a circuit diagram of a filter in accordance with a first comparative example. As illustrated in FIG. 4, in a filter 110 of the first comparative example, neither the inductor L2 nor L3 is provided, and the second end of the inductor L1 is coupled to the ground terminal Tg. A parasitic inductance Lg is connected between the ground terminal Tg and a ground.

As illustrated in FIG. 2, the parasitic inductance Lg is formed in the path from the terminal 14 to the terminal 22 through the bonding material 24. Depending on the thickness of the bonding material 24 and the kind of the bonding material 24, the parasitic inductance Lg varies. For example, depending on the mounting method used to mount the multilayered body 10 on the substrate 20, the parasitic inductance Lg varies. The parasitic inductance Lg differs between when a conductive sheet is used as the bonding material 24 to evaluate the multilayered body 10 and when solder is used as the bonding material 24 to mount the multilayered body 10. As described above, the parasitic inductance Lg varies with external influences.

Simulation 1

The transmission characteristics of the filter 110 of the first comparative example were simulated for different parasitic inductances Lg. The simulation is a circuit simulation. Table 1 presents the capacitances of the capacitors C1 to C3, the inductance of the inductor L1, the parasitic inductance Lg, and the frequency of an attenuation pole Att in a simulation 1.

TABLE 1

| Filter | C1 [pF] | C2 [pF] | C3 [pF] | L1 [nH] | Lg [nH] | Att [GHz] |
|---|---|---|---|---|---|---|
| A1 | 0.4 | 0.4 | 0.5 | 1.5 | 0 | 3.881 |
| A2 | 0.4 | 0.4 | 0.5 | 1.5 | 0.03 | 3.843 |
| A3 | 0.4 | 0.4 | 0.5 | 1.5 | 0.06 | 3.806 |

As presented in Table 1, the capacitances of the capacitors C1 to C3 were set at 0.4 pF, 0.4 pF, and 0.5 pF, respectively, and the inductance of the inductor L1 was set at 1.5 nH. The parasitic inductances Lg of the filters A1, A2, and A3 were set at 0 nH, 0.03 nH, and 0.06 nH, respectively.

Figure 5A:
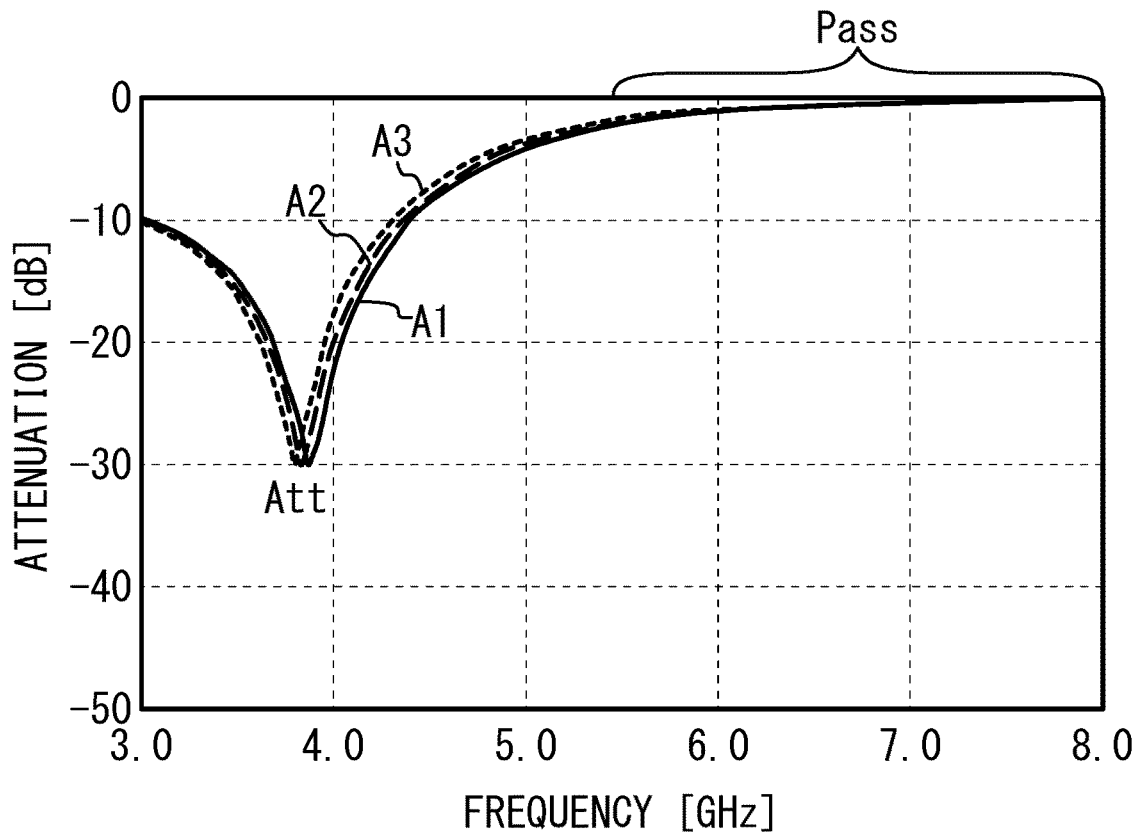
FIG. 5A and FIG. 5B illustrate the transmission characteristics of filters A1 to A3 in a simulation 1.
Figure 5B:
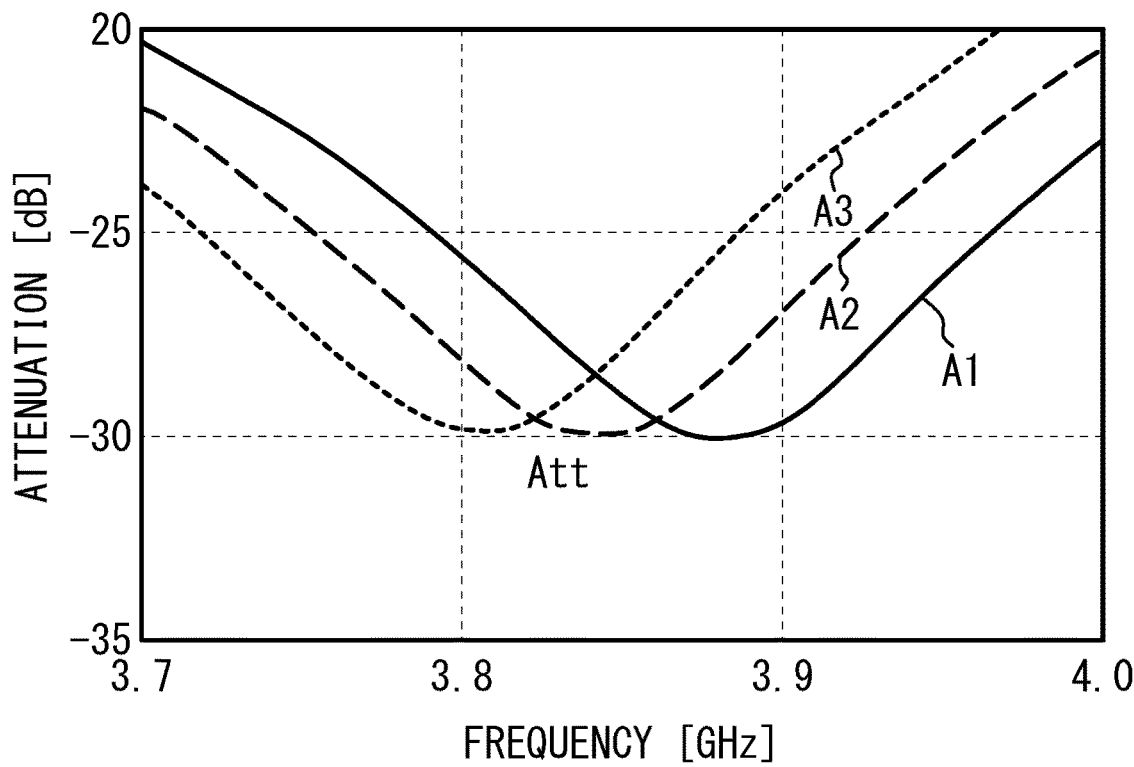

FIG. 5A and FIG. 5B illustrate the transmission characteristics of the filters A1 to A3 in the simulation 1. FIG. 5B is an enlarged view of the transmission characteristics around the attenuation pole. As illustrated in FIG. 5A, the capacitors C1 and C2 and the inductors L1 to L3 form a T-type CLC high-pass filter, and the T-type CLC high-pass filter has a passband Pass of approximately 5.5 GHz or greater. Addition of the capacitor C3 forms the attenuation pole Att having a local minimum at a frequency lower than the passband Pass because of the capacitors C1 to C3 and the inductors L1 to L3. The frequency of the attenuation pole Att is approximately 3.9 GHz. When the node N1 is directly connected to the capacitor C3, the attenuation pole Att is not formed. By making the path connecting the capacitor C3 and the node N1 only two paths: the path from the capacitor C3 to the node N1 via the capacitor C1 and the path from the capacitor C3 to the node N1 via the capacitor C2, the attenuation pole Att is formed.

As presented in FIG. 5B and Table 1, in the filter A1 with no parasitic inductance Lg, the frequency of the attenuation pole Att is 3.881 GHz. In the filter A2 with a parasitic inductance Lg of 0.03 nH, the frequency of the attenuation pole Att is 3.843 GHz, and is lower than that of the filter A1. In the filter A3 with a parasitic inductance Lg of 0.06 nH, the frequency of the attenuation pole Att is 3.806 GHz, and is lower than that of the filter A1. As seen from the above, in the first comparative example, the variation in parasitic inductance Lg varies the frequency of the attenuation pole Att, resulting in the variation in filter characteristics. Therefore, when the multilayered body 10 is mounted on the substrate 20, the variation in parasitic inductance Lg due to the production tolerance of the substrate 20, the variability in positions of the terminals 14 and 22, and/or the variability in the amount of the bonding material 24 results in the variation in filter characteristics. In addition, when the multilayered body 10 is inspected, the variation in parasitic inductance Lg due to the variability of the inspection board, the variability in positions of the terminals 14 and 22, and/or the variability in degree of the inclination of the surfaces of the terminals 14 and 22 results in the variation in filter characteristics. Furthermore, when the parasitic inductance Lg differs between the mounting and the inspection, the filter characteristics differ. Since the parasitic inductance Lg is unstable as described above, the filter characteristics are unstable.

Simulation 2

In the first embodiment, for different parasitic inductances Lg1 and Lg2, the transmission characteristics of the filter 100 were simulated. The simulation is a circuit simulation. Table 2 presents the capacitances of the capacitors C1 to C3, the inductances of the inductors L1 to L3, the parasitic inductances Lg1 and Lg2 and the frequency of the attenuation pole Att in a simulation 2.

TABLE 2

| Filter | C1 [pF] | C2 [pF] | C3 [pF] | L1 [nH] | L2 [nH] | L3 [nH] | Lg1 [nH] | Lg2 [nH] | Att [GHz] |
|---|---|---|---|---|---|---|---|---|---|
| B1 | 0.4 | 0.4 | 0.5 | 1.4 | 0.2 | 0.2 | 0 | 0 | 3.881 |
| B2 | 0.4 | 0.4 | 0.5 | 1.4 | 0.2 | 0.2 | 0.03 | 0.03 | 3.862 |
| B3 | 0.4 | 0.4 | 0.5 | 1.4 | 0.2 | 0.2 | 0.06 | 0.03 | 3.853 |
| B4 | 0.4 | 0.4 | 0.5 | 1.4 | 0.2 | 0.2 | 0.06 | 0.06 | 3.843 |

As presented in Table 2, the capacitances of the capacitors C1 to C3 were set at 0.4 pF, 0.4 pF, and 0.5 pF, respectively, and the inductances of the inductors L1 to L3 were set at 1.4 nH, 0.2 nH, and 0.2 nH, respectively. In the filter B1, each of the parasitic inductances Lg1 and Lg2 was set at 0 nH. In the filter B2, each of the parasitic inductances Lg1 and Lg2 was set at 0.03 nH. In the filter B3, the parasitic inductances Lg1 and Lg2 were set at 0.06 nH and 0.03 nH, respectively. In the filter B4, each of the parasitic inductances Lg1 and Lg2 was set at 0.06 nH.

Figure 6A:
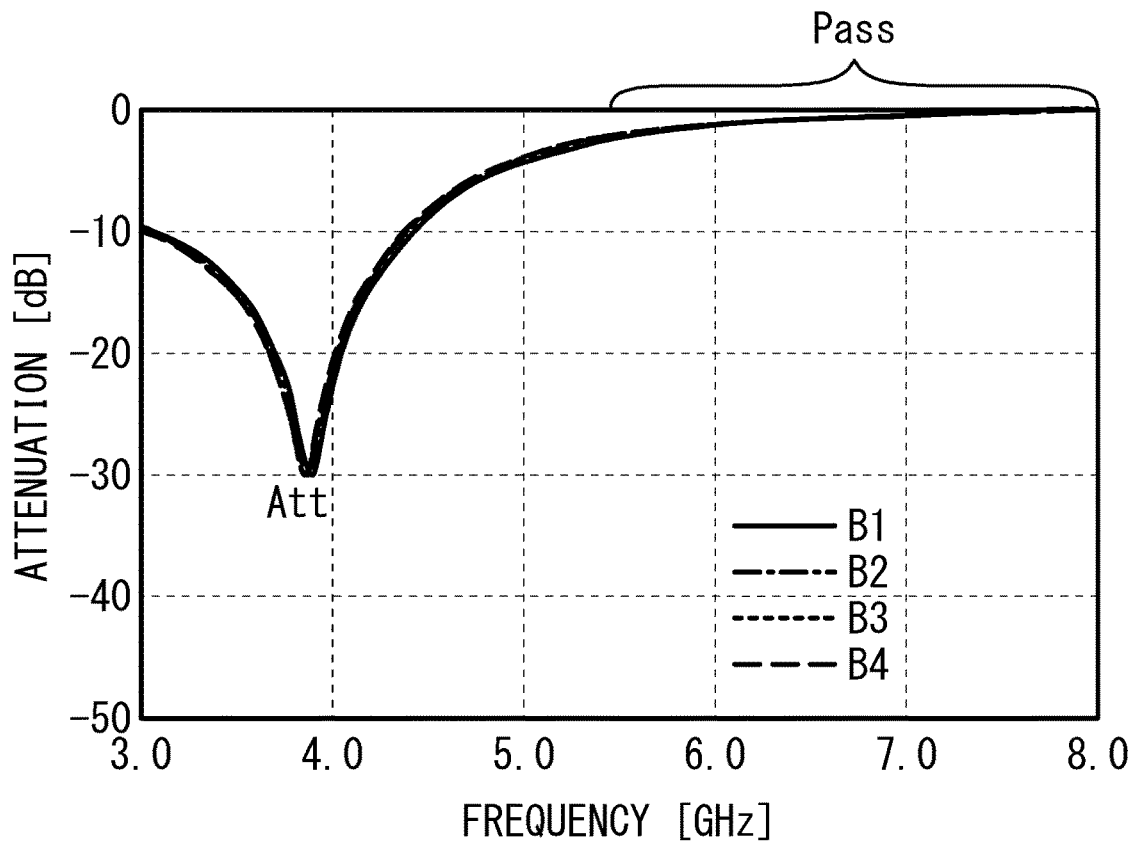
FIG. 6A and FIG. 6B illustrate the transmission characteristics of filters B1 to B4 in a simulation 2.
Figure 6B:
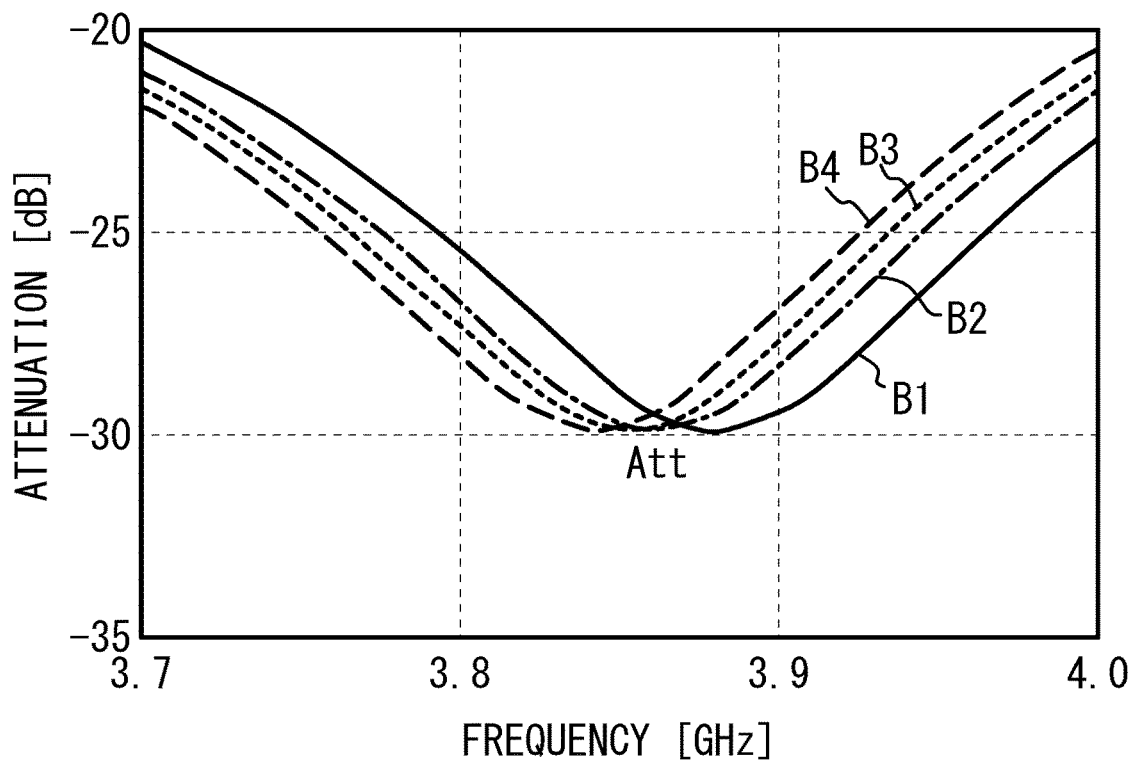

FIG. 6A and FIG. 6B illustrate the transmission characteristics of the filters B1 to B4 in the simulation 2. FIG. 6B is an enlarged view of the transmission characteristics around the attenuation pole. As illustrated in FIG. 6A, the transmission characteristics of the filters B1 to B4 are substantially the same as the transmission characteristics of the filters A1 to A3. The passband Pass and the attenuation pole Att are formed.

As presented in FIG. 6B and Table 2, in the filter B1 in which the parasitic inductances Lg1 and Lg2 are 0 nH, the frequency of the attenuation pole Att is 3.881 GHz, and is the same as that of the filter A1. In the filter B2 in which the parasitic inductances Lg1 and Lg2 are 0.03 nH, the frequency of the attenuation pole Att is 3.862 GHz. In the filter B3 in which the parasitic inductances Lg1 and Lg2 are 0.06 nH and 0.03 nH, respectively, the frequency of the attenuation pole Att is 3.853 GHz. In the filter B4 in which the parasitic inductances Lg1 and Lg2 are 0.06 nH, the frequency of the attenuation pole Att is 3.843 GHz. Also in the filters B1 to B4 of the first embodiment, the frequency of the local minimum of the attenuation pole Att varies with the parasitic inductances Lg1 and Lg2. In the first comparative example, the variation in frequency of the attenuation pole Att when the parasitic inductance Lg varies from 0 nH to 0.06 nH is −0.078 GHz. By contrast, in the first embodiment, the variation in frequency of the attenuation pole Att when the parasitic inductances Lg1 and Lg2 vary from 0 nH to 0.06 nH is −0.038 GHz. As seen from the above, in the first embodiment, the variation in frequency of the attenuation pole Att due to the parasitic inductance can be made to be approximately ½ of that of the first comparative example. As described above, in the first embodiment, the parasitic inductances Lg1 and Lg2 connected between the node N1 and a ground are connected in parallel. Thus, the substantial parasitic inductance becomes less than the parasitic inductance Lg of the first comparative example.

Simulation 3

The transmission characteristics of the filter 100 were simulated in the first embodiment for different ratios of the inductance of the inductor L2 to the inductance of the inductor L3. The simulation is a circuit simulation. Table 3 and Table 4 present the capacitances of the capacitors C1 to C3, the inductances of the inductors L1 to L3, the parasitic inductances Lg1 and Lg2, and the frequency of the attenuation pole Att in a simulation 3.

TABLE 3

| Filter | C1 [pF] | C2 [pF] | C3 [pF] | L1 [nH] | L2 [nH] | L3 [nH] | Lg1 [nH] | Lg2 [nH] | Att [GHz] |
|---|---|---|---|---|---|---|---|---|---|
| C1 | 0.4 | 0.4 | 0.5 | 1.5 | 0 | 0.2 | 0.06 | 0.06 | 3.820 |
| C2 | 0.4 | 0.4 | 0.5 | 1.478 | 0.025 | 0.2 | 0.06 | 0.06 | 3.824 |
| C3 | 0.4 | 0.4 | 0.5 | 1.46 | 0.05 | 0.2 | 0.06 | 0.06 | 3.828 |
| C4 | 0.4 | 0.4 | 0.5 | 1.433 | 0.1 | 0.2 | 0.06 | 0.06 | 3.834 |
| C5 | 0.4 | 0.4 | 0.5 | 1.414 | 0.15 | 0.2 | 0.06 | 0.06 | 3.840 |

TABLE 4

| Filter | C1 [pF] | C2 [pF] | C3 [pF] | L1 [nH] | L2 [nH] | L3 [nH] | Lg1 [nH] | Lg2 [nH] | Att [GHz] |
|---|---|---|---|---|---|---|---|---|---|
| D1 | 0.4 | 0.4 | 0.5 | 1.5 | 0 | 0.2 | 0.03 | 0.03 | 3.847 |
| D2 | 0.4 | 0.4 | 0.5 | 1.478 | 0.025 | 0.2 | 0.03 | 0.03 | 3.849 |
| D3 | 0.4 | 0.4 | 0.5 | 1.46 | 0.05 | 0.2 | 0.03 | 0.03 | 3.850 |
| D4 | 0.4 | 0.4 | 0.5 | 1.433 | 0.1 | 0.2 | 0.03 | 0.03 | 3.856 |
| D5 | 0.4 | 0.4 | 0.5 | 1.414 | 0.15 | 0.2 | 0.03 | 0.03 | 3.861 |

As presented in Table 3, in the filters C1 to C5, the parasitic inductances Lg1 and Lg2 were set at 0.06 nH, and the inductance of the inductor L2 was varied. The inductance of the inductor L1 was set so that the inductance between the node N1 and the ground terminal Tg1 and the inductance between the node N1 and the ground terminal Tg2 were 1.5 nH. The capacitances of the capacitors C1 to C3 and the inductance of the inductor L2 are the same as those of the filters B1 to B4.

As presented in Table 4, in filters D1 to D5, the parasitic inductances Lg1 and Lg2 were set at 0.03 nH, and the inductance of the inductor L2 was varied. The inductance of the inductor L1 was set so that the inductance between the node N1 and the ground terminal Tg1 and the inductance between the node N1 and the ground terminal Tg2 were 1.5 nH. The capacitances of the capacitors C1 to C3 and the inductance of the inductor L2 are the same as those of the filters B1 to B4.

Figure 7A:
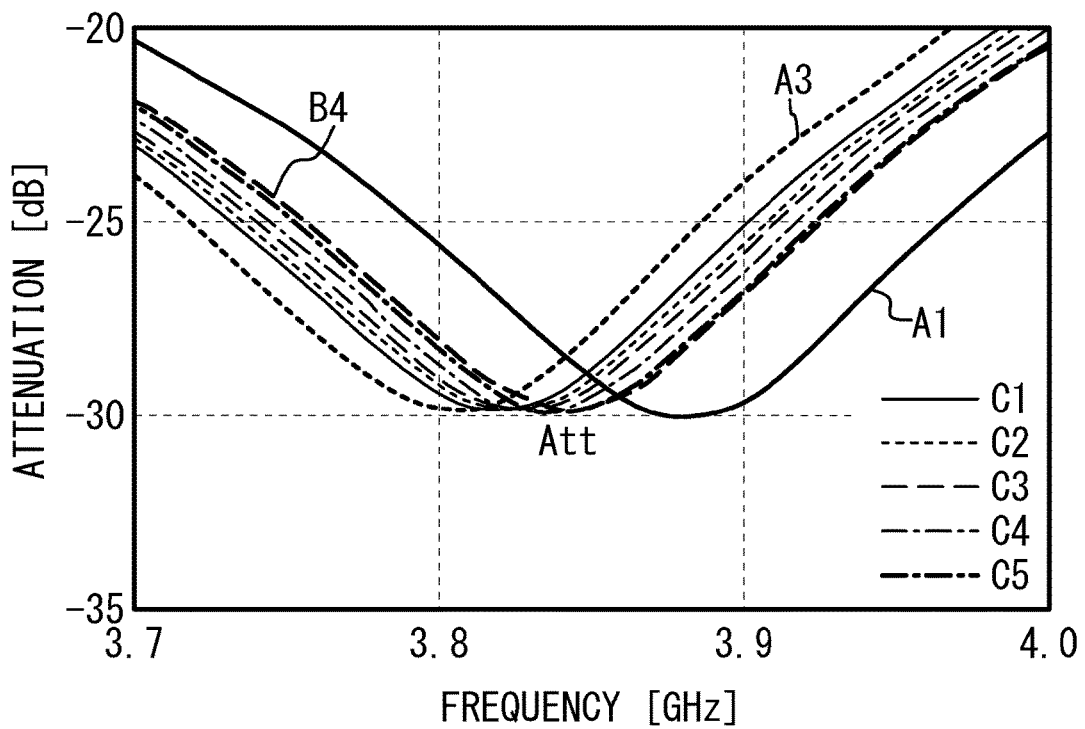
FIG. 7A illustrates the transmission characteristics of filters A1, A3, B4, and C1 to C5 in a simulation 3.
Figure 7B:
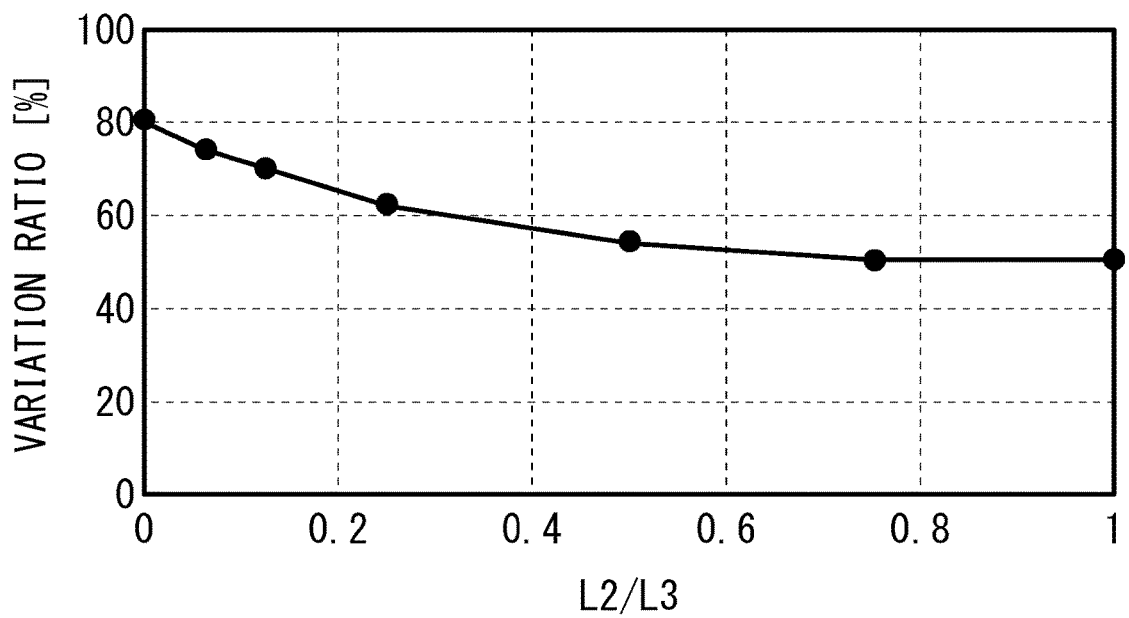
FIG. 7B illustrates a variation ratio with respect to L2/L3 in the simulation 3.

FIG. 7A illustrates the transmission characteristics of the filters A1, A3, B4, and C1 to C5 in the simulation 3. FIG. 7B illustrates the variation ratio with respect to L2/L3 in the simulation 3. L2/L3 is (the inductance of L2)/(the inductance of L3). The variation ratio corresponds to the ratio of the difference between the frequency of the attenuation pole Att of the filter A1 and the frequency of the attenuation pole Att of each of the filters B4 and C1 to C5 of the first embodiment to the difference between the frequency of the attenuation pole Att of the filter A1 and the frequency of the attenuation pole Att of the filter A3 in the first comparative example. That is, the variation ratio is ((the frequency of the attenuation pole Att of A1)−(the frequency of the attenuation pole Att of each of B4 and C1 to C5))/((the frequency of the attenuation pole Att of A1)−(the frequency of the attenuation pole Att of A3))×100[%]. The variation ratio closer to 0 indicates the smaller variation in frequency of the attenuation pole Att even when the parasitic inductances Lg1 and Lg2 are added. Dots in FIG. 7B indicate simulated points, and the straight lines are lines connecting the dots.

As illustrated in FIG. 7A, the attenuation poles Att in the filters C1 to C5 and B4 are closer to the attenuation pole Att of the filter A1 than the attenuation pole Att of the filter A3. As illustrated in FIG. 7B, when L2/L3 is 0, the variation ratio is 80%. As L2/L3 increases, the variation ratio decreases. When L2/L3 is 0.3, the variation ratio is 60%. When L2/L3 is 0.5, the variation ratio is nearly 50%. When L2/L3 is 1, the variation ratio is approximately 50%.

Figure 8A:
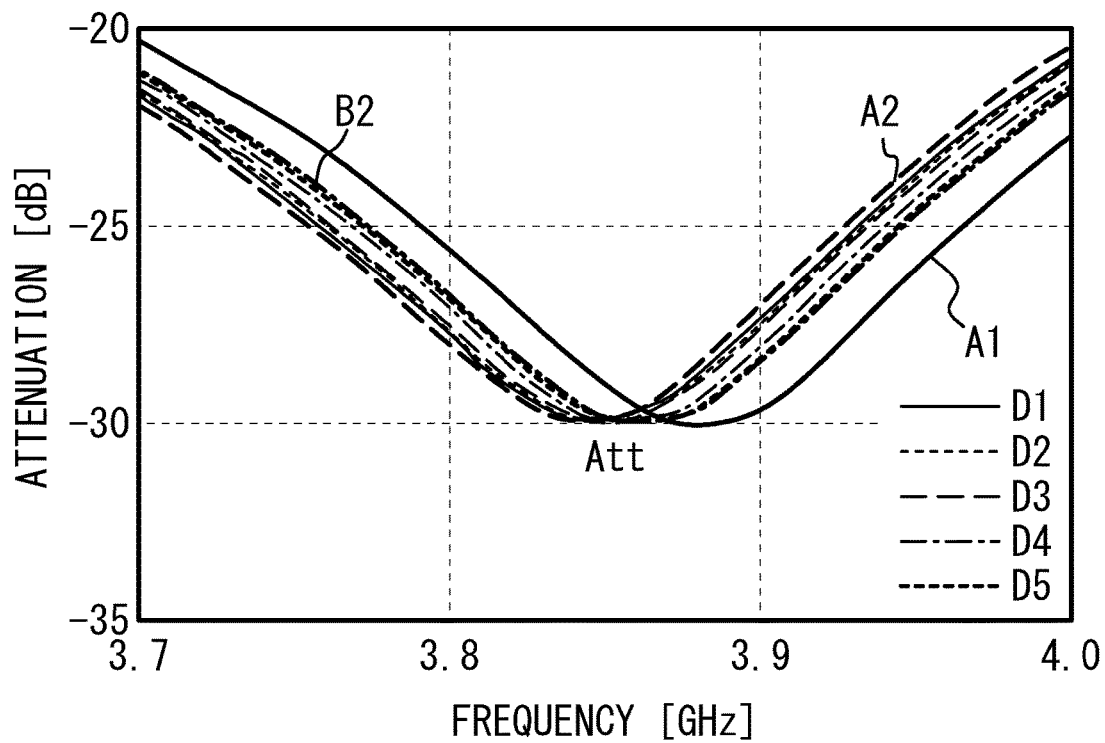
FIG. 8A illustrates the transmission characteristics of filters A1, A2, B2, and D1 to D5 in the simulation 3.
Figure 8B:
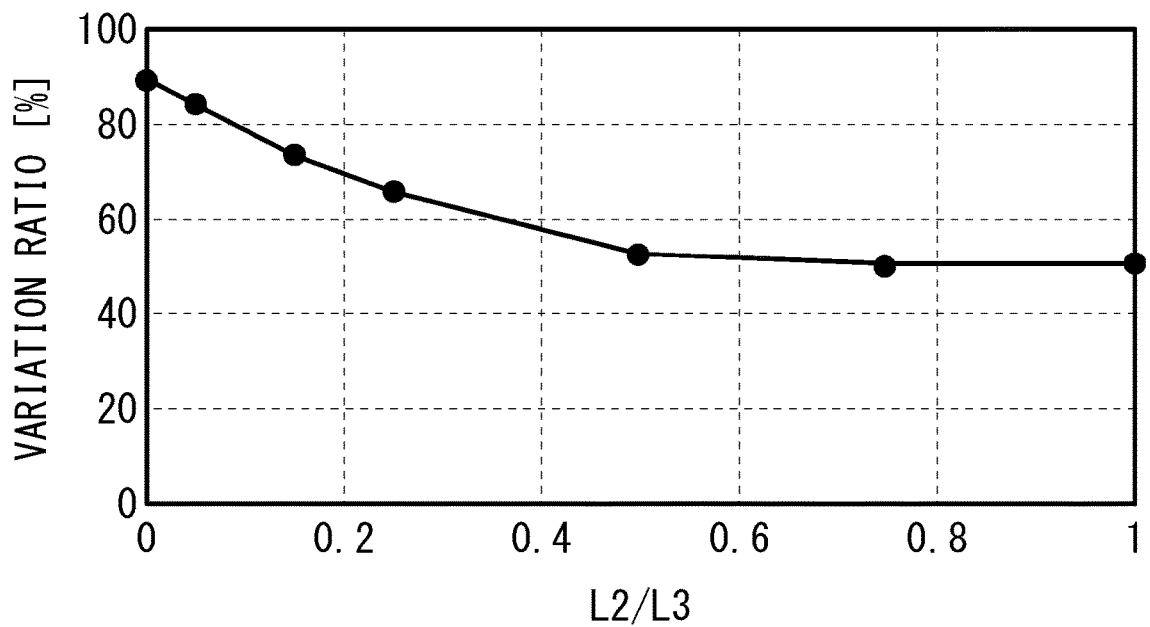
FIG. 8B illustrates a variation ratio with respect to L2/L3 in the simulation 3.

FIG. 8A illustrates the transmission characteristics of the filters A1, A2, B2, and D1 to D5 in the simulation 3. FIG. 8B illustrates the variation ratio with respect to L2/L3 in the simulation 3. The variation ratio is ((the frequency of the attenuation pole Att of A1)−(the frequency of the attenuation pole Att of each of B2 and D1 to D5))/((the frequency of the attenuation pole Att of A1)−(the frequency of the attenuation pole Att of A2))×100 [%].

As illustrated in FIG. 8A, the attenuation pole Att in each of the filters D1 to D5 and B2 is closer to the attenuation pole Att of the filter A1 than the attenuation pole Att of the filter A2. As illustrated in FIG. 8B, when L2/L3 is 0, the variation ratio is 90%. As L2/L3 increases, the variation ratio decreases. When L2/L3 is 0.5, the variation ratio is nearly 50%. When L2/L3 is 1, the variation ratio is approximately 50%. As clear from the simulation 3, L2/L3 is preferably closer to 1.

First Variation of the First Embodiment

Figure 9:
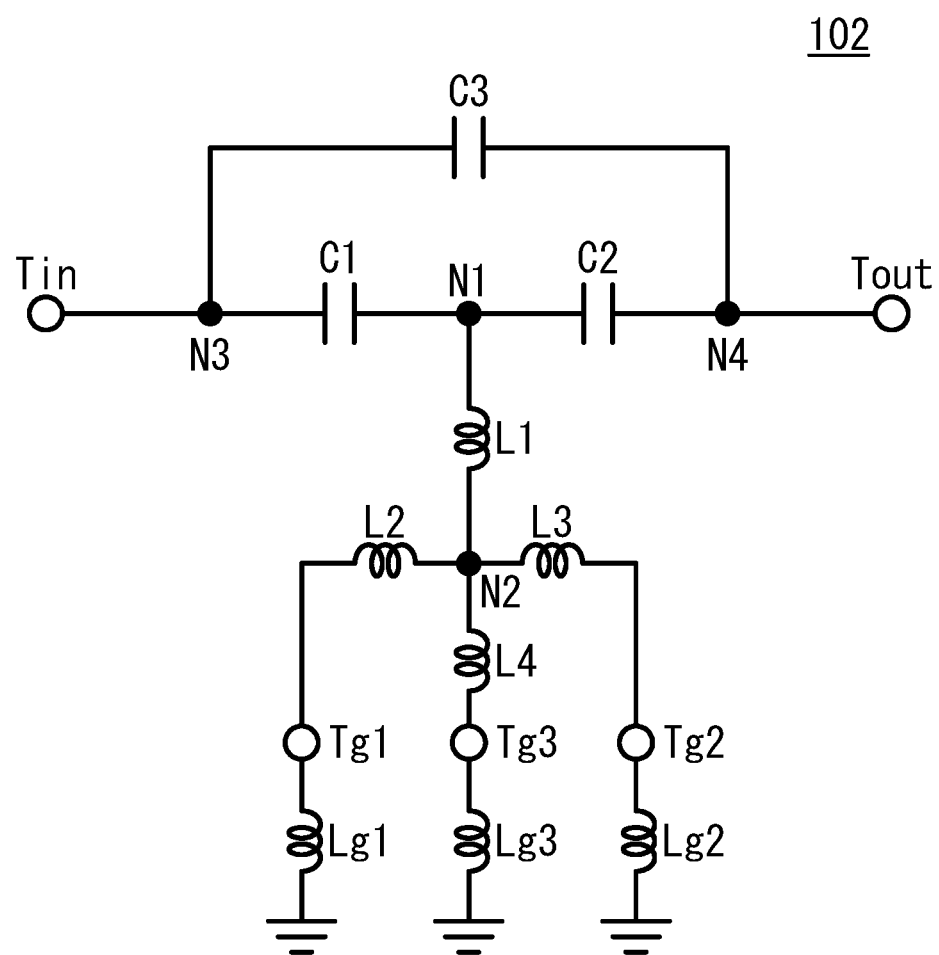
FIG. 9 is a circuit diagram of a filter in accordance with a first variation of the first embodiment.

FIG. 9 is a circuit diagram of a filter in accordance with a first variation of the first embodiment. As illustrated in FIG. 9, in a filter 102 of the first variation of the first embodiment, an inductor L4 is connected between the node N2 and a ground terminal Tg3. A parasitic inductance Lg3 is connected between the ground terminal Tg3 and a ground.

Figure 10A:
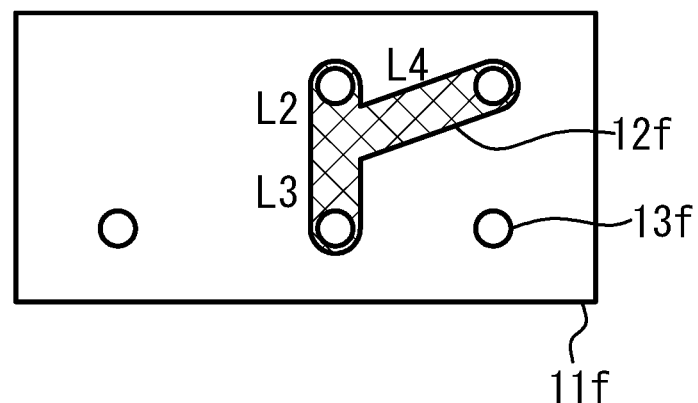
FIG. 10A and FIG. 10B are plan views of the dielectric layers in the first variation of the first embodiment.
Figure 10B:
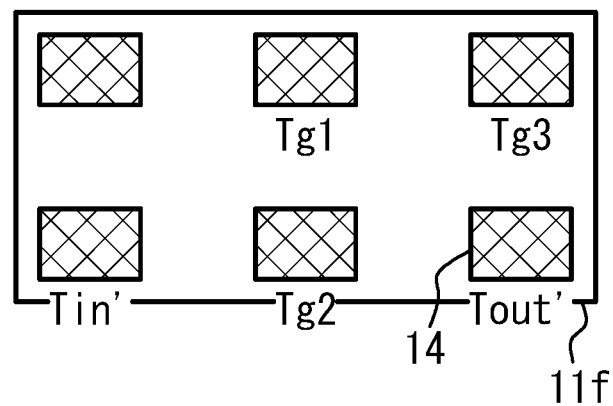

FIG. 10A and FIG. 10B are plan views of dielectric layers in the first variation of the first embodiment. FIG. 10A is a plan view of the dielectric layer 11f as viewed from the above. FIG. 10B is a plan view of the terminals 14 through the dielectric layer 11f. As illustrated in FIG. 10A, the conductive pattern 12f provided on the dielectric layer 11f forms inductors L2 to L4. As illustrated in FIG. 10B, the terminals 14 provided under the dielectric layer 11f form the input terminal Tin', the output terminal Tout', and the ground terminals Tg1 to Tg3. Other structures are the same as those of the first embodiment, and the description thereof is thus omitted.

Simulation 4

The inductance of each of the inductors L3 and L4 was set at 0.1 nH in the first variation of the first embodiment, and the transmission characteristics of the filter 102 were simulated for different inductances of the inductor L2. The capacitances of the capacitors C1 to C3 were set at the same as those of the simulations 1 to 3, the inductance of the inductor L1 was set so that the inductance between the node N1 and each of the ground terminals Tg1 to Tg3 was 1.5 nH, and each of the parasitic inductances Lg1 to Lg3 was set at 0.03 nH.

Figure 11:
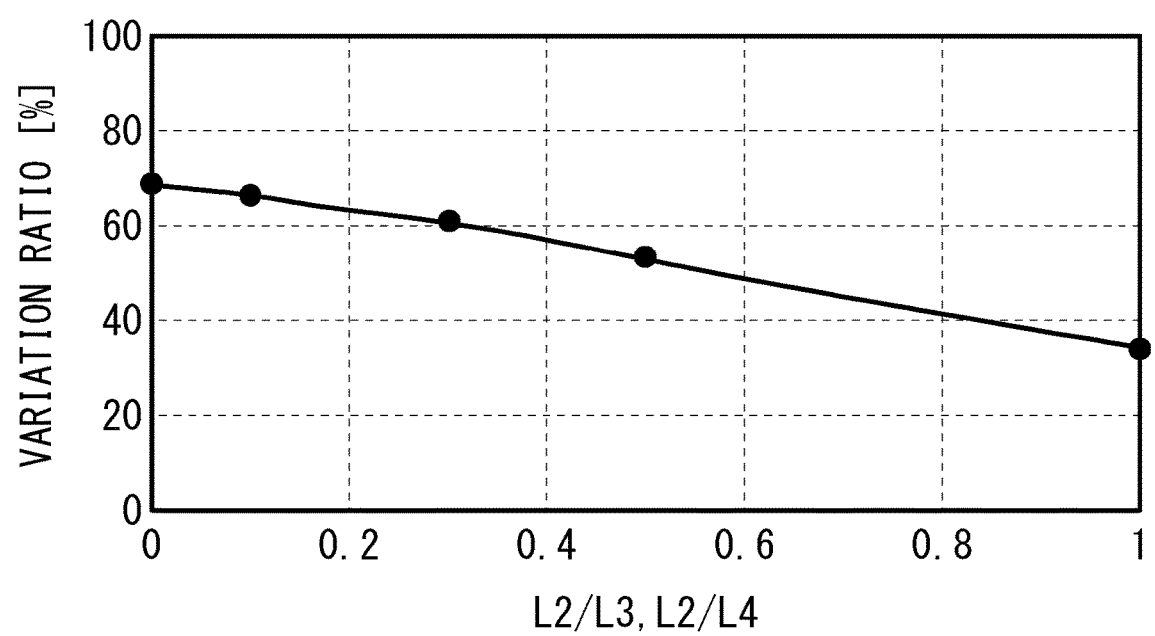
FIG. 11 illustrates a variation ratio with respect to L2/L3 and L2/L4 in a simulation 4.

FIG. 11 illustrates the variation ratio with respect to L2/L3 and L2/L4 in a simulation 4. The variation ratio is ((the frequency of the attenuation pole Att of A1)−(the frequency of the attenuation pole Att of the first variation of the first embodiment))/((the frequency of the attenuation pole Att of A1)−(the frequency of the attenuation pole Att of A2))×100 [%]. Dots in FIG. 11 indicate simulated points, and the straight lines are lines connecting the dots.

As illustrated in FIG. 11, when L2/L3 and L2/L4 are 0 (L2/L3=L2/L4=0), the variation ratio is approximately 70%. When L2/L3 and L2/L4 are 0.3 (L2/L3=L2/L4=0.3), the variation ratio is approximately 60%, and when L2/L3 and L2/L4 are 0.5 (L2/L3=L2/L4=0.5), the variation ratio is approximately 50%. When L2/L3 and L2/L4 are 1 (L2/L3=L2/L4=1), the variation ratio is approximately 35%.

As in the first variation of the first embodiment, the number of inductors connected in parallel between the node N1 and a ground may be three or more. As the number of inductors increases, the variation ratio becomes less.

Second Variation of the First Embodiment

Figure 12:
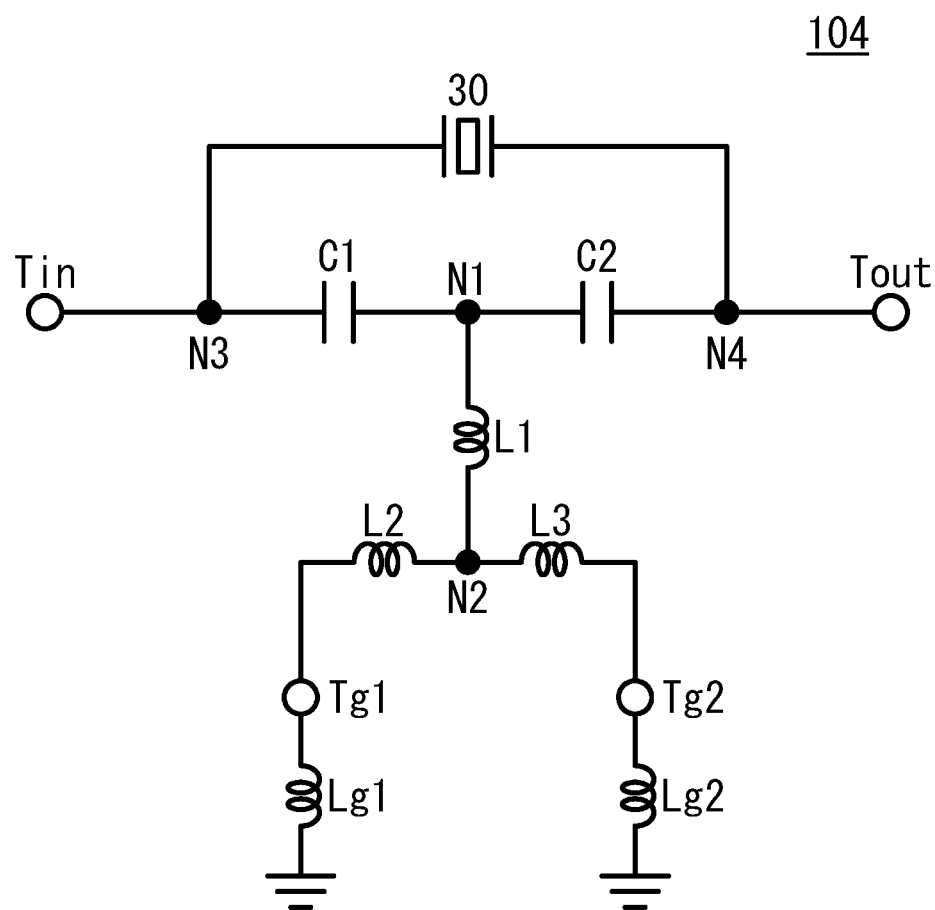
FIG. 12 is a circuit diagram of a filter in accordance with a second variation of the first embodiment.

FIG. 12 is a circuit diagram of a filter in accordance with a second variation of the first embodiment. As illustrated in FIG. 12, in a filter 104 of the second variation of the first embodiment, an acoustic wave resonator 30 is provided instead of the capacitor C3. Other structures are the same as those of the first embodiment, and the description thereof is thus omitted.

Figure 13A:
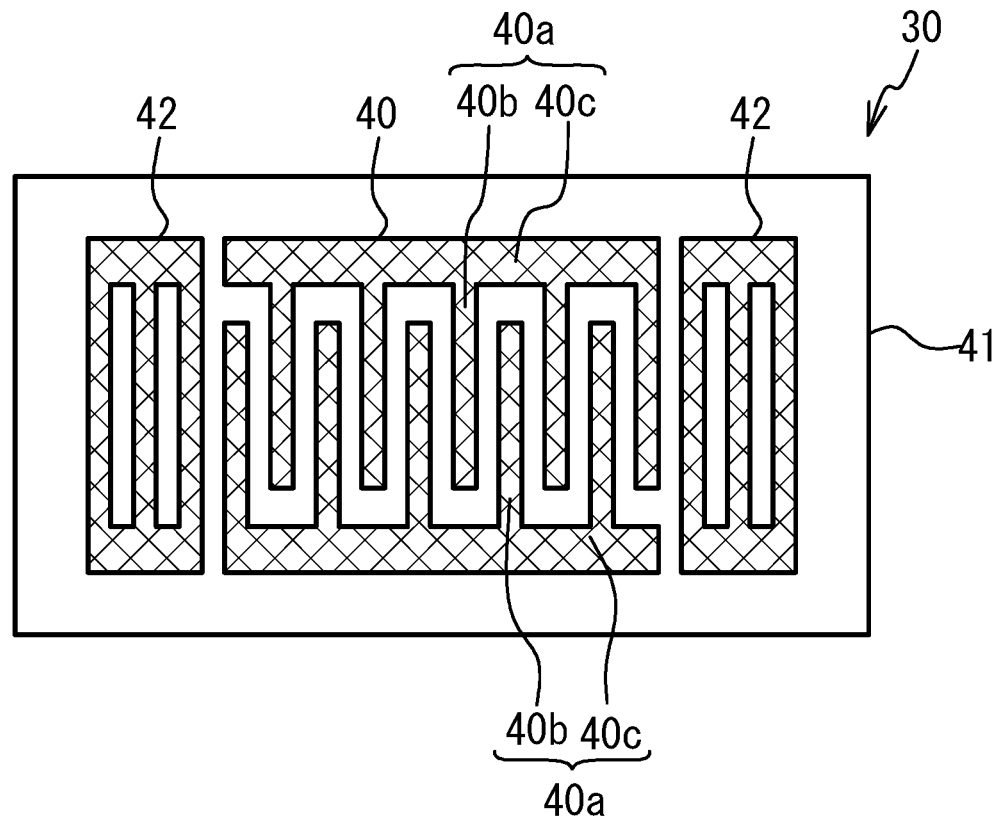
FIG. 13A is a plan view of an acoustic wave resonator in a second variation of the first embodiment.
Figure 13B:
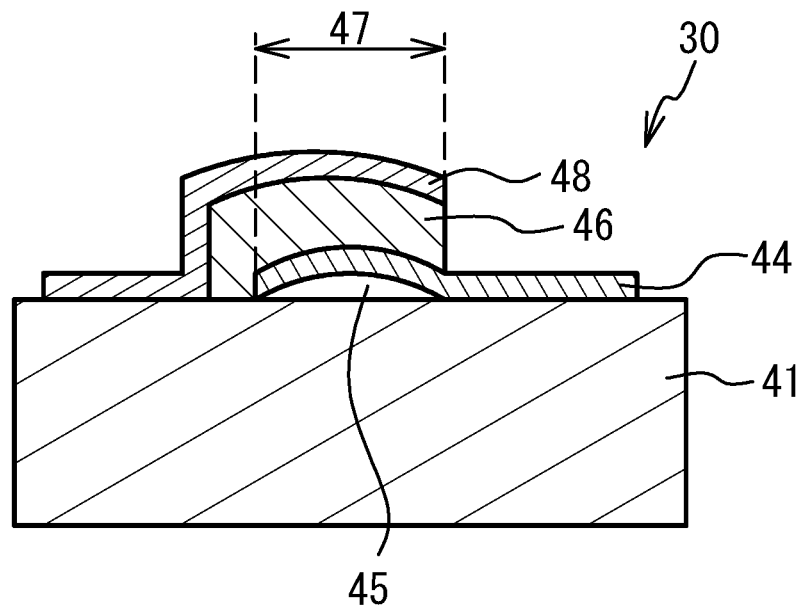
FIG. 13B is a cross-sectional view of another acoustic wave resonator in accordance with the second variation of the first embodiment.

FIG. 13A is a plan view of an acoustic wave resonator in accordance with the second variation of the first embodiment, and FIG. 13B is a cross-sectional view of another acoustic wave resonator in accordance with the second variation of the first embodiment. In the example of FIG. 13A, the acoustic wave resonator 30 is a surface acoustic wave resonator. An interdigital transducer (IDT) 40 and reflectors 42 are disposed on the top surface of a substrate 41. The IDT 40 includes a pair of comb-shaped electrodes 40a opposite to each other. The comb-shaped electrode 40a includes electrode fingers 40b and a bus bar 40c connecting the electrode fingers 40b. The reflectors 42 are located at both sides of the IDT 40. The IDT 40 excites the surface acoustic wave on the substrate 41. The substrate 41 is a piezoelectric substrate such as, but not limited to, a lithium tantalate substrate, a lithium niobate substrate, or a crystal substrate. The substrate 41 may be a composite substrate in which a piezoelectric substrate is bonded on a support substrate such as, but not limited to, a sapphire substrate, a spinel substrate, an alumina substrate, a crystal substrate, or a silicon substrate. The IDT 40 and the reflectors 42 are formed of, for example, an aluminum film or a copper film. A passivation film or a temperature compensation film may be provided on the substrate 41 so as to cover the IDT 40 and the reflectors 42.

In the example of FIG. 13B, the acoustic wave resonator 30 is a piezoelectric thin film resonator. A piezoelectric film 46 is provided on the substrate 41. A lower electrode 44 and an upper electrode 48 are provided so as to sandwich the piezoelectric film 46 therebetween. An air gap 45 is formed between the lower electrode 44 and the substrate 41. The region where the lower electrode 44 and the upper electrode 48 are opposite to each other across at least a part of the piezoelectric film 46 is a resonance region 47. The lower electrode 44 and the upper electrode 48 in the resonance region 47 excite the acoustic wave in the thickness extension mode or the acoustic wave in the thickness-shear mode within the piezoelectric film 46. The substrate 41 is, for example, a sapphire substrate, a spinel substrate, an alumina substrate, a glass substrate, a crystal substrate, or a silicon substrate. The lower electrode 44 and the upper electrode 48 are formed of a metal films such as a ruthenium film. The piezoelectric film 46 is, for example, an aluminum nitride film, a monocrystalline lithium tantalate film, or a monocrystalline lithium niobate film. Instead of the air gap 45, the acoustic mirror may be provided.

Figure 14:
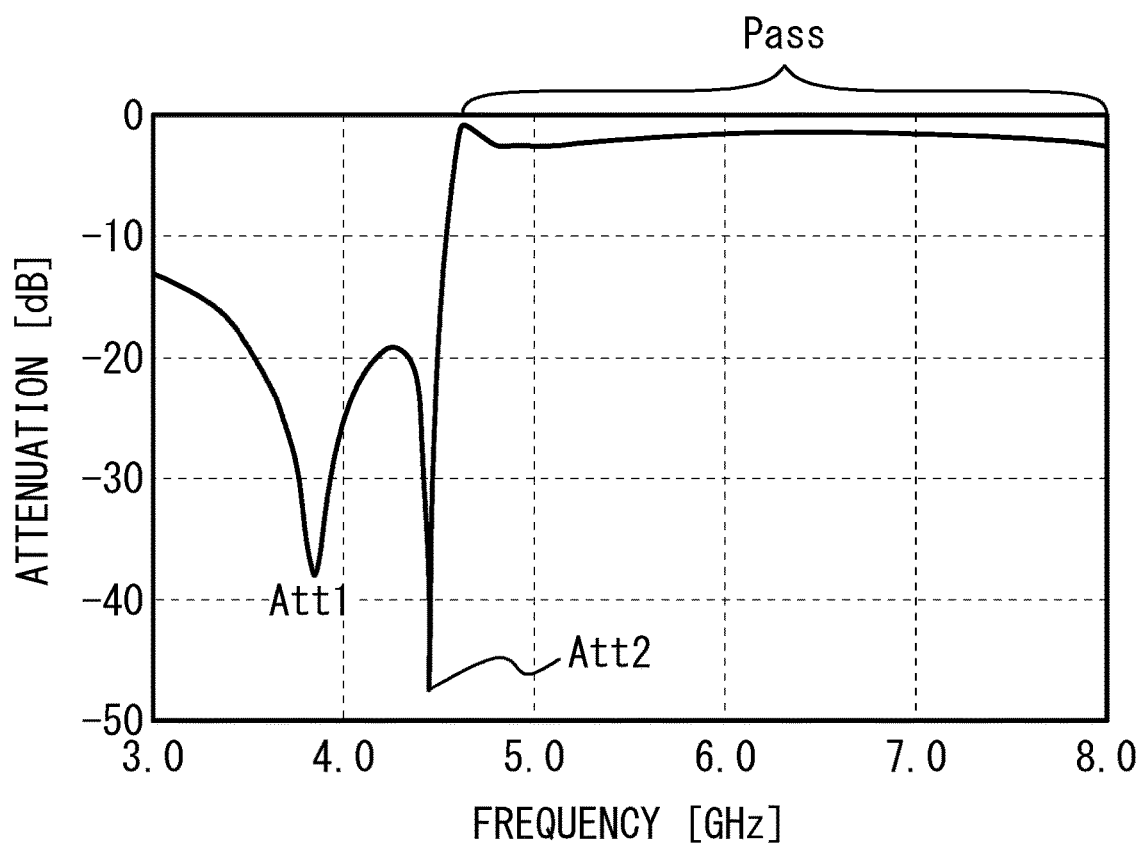
FIG. 14 illustrates the transmission characteristics of a filter in accordance with the second variation of the first embodiment.

FIG. 14 illustrates the transmission characteristics of the filter in accordance with the second variation of the first embodiment. The transmission characteristics are the same as those of the filter B1 except for the acoustic wave resonator 30, and the resonant frequency of the acoustic wave resonator 30 is 3.893 GHz. As illustrated in FIG. 14, the passband Pass is approximately 4.6 GHz or greater. The acoustic wave resonator 30 is capacitive at the frequency of the attenuation pole Att1. The capacitors C1 and C2, the inductors L1 to L3, and the capacitance of the acoustic wave resonator 30 form the attenuation pole Att1. Between the passband Pass and the attenuation pole Att1, an attenuation pole Att2 is formed by the resonant frequency of the acoustic wave resonator 30. The steepness of the attenuation between the passband Pass and the attenuation range can be improved by the attenuation pole Att2.

Also in the second variation of the first embodiment, the variation in frequency of the attenuation pole Att1 results in variation in characteristics within the attenuation range of the filter 104. Provision of the inductors L2 and L3 reduces the variation in frequency of the attenuation pole Att1 even when the parasitic inductances Lg1 and Lg2 vary, reducing the variation in filter characteristics.

Third Variation of the First Embodiment

Figure 15:
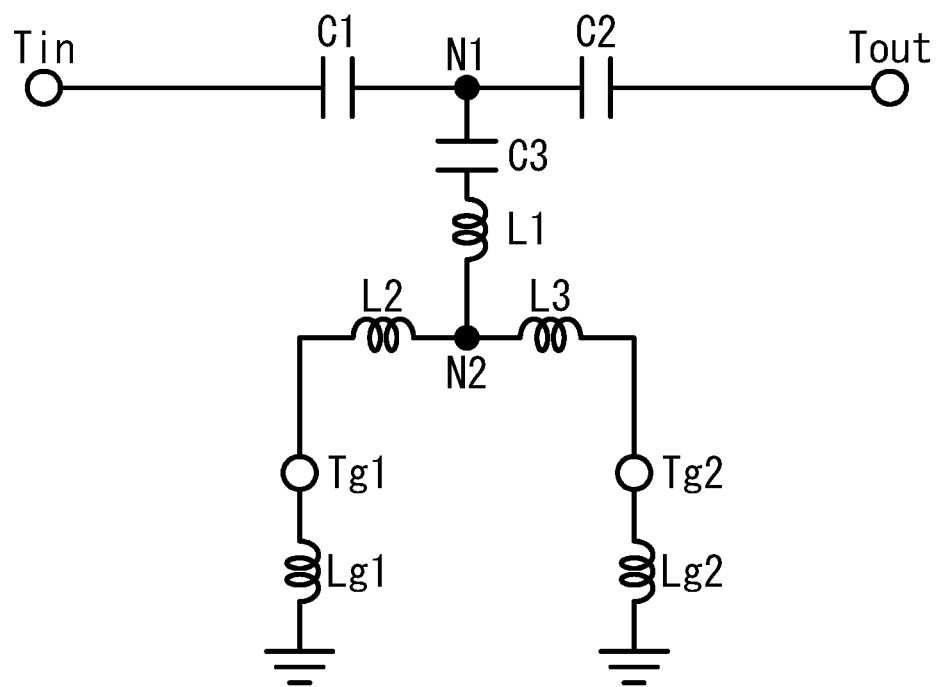
FIG. 15 is a circuit diagram of a filter in accordance with a third variation of the first embodiment.

FIG. 15 is a circuit diagram of a filter in accordance with a third variation of the first embodiment. As illustrated in FIG. 15, in a filter 106 of the third variation of the first embodiment, the capacitor C3 is connected in series with the inductor L1 between the nodes N1 and N2. In the third variation of the first embodiment, the attenuation pole Att equivalent to that in the first embodiment can be formed by the series resonant circuit formed of the capacitor C3 and the inductors L1 to L3. Other structures are the same as those of the first embodiment, and the description thereof is thus omitted.

As in FIG. 4 of the first comparative example, in the filter having the inductor L1 shunt-connected to the path between the input terminal Tin and the output terminal Tout, the filter characteristics vary as the parasitic inductance Lg varies as presented in FIG. 5B and Table 1. This results in large variation in filter characteristics due to the mounting method of the terminals 14 and 22 in FIG. 2 and other factors.

In the first embodiment and the variations of the first embodiment, the inductor L1 (a first inductor) has a first end coupled to the node N1 (a first node) in the path between the input terminal Tin and the output terminal Tout, and a second end coupled to the node N2 (a second node). The inductor L2 (a second inductor) has a first end coupled to the node N2, and a second end coupled to the ground terminal Tg1 (a first ground terminal). The inductor L3 (a third inductor) has a first end coupled to the node N1, and a second end coupled to the ground terminal Tg2 (a second ground terminal). This reduces the variation in combined inductance of the inductances of the shunt-connected inductors L1 to L3 and the inductances Lg1 and Lg2 when the parasitic inductances Lg1 and Lg2 vary because the parasitic inductances Lg1 and Lg2 for connecting the terminals 14 and 22 are connected in parallel, as presented in FIG. 6B and Table 2. Therefore, independently from the variability such as the mounting method of the terminals 14 and 22 in FIG. 2, the filter characteristics can be stabilized.

As illustrated in FIG. 6A, the filter is a high-pass filter having a passband Pass, and has the local minimum of the attenuation pole Att at a frequency lower than the passband Pass because of the resonant circuit including the inductors L1 to L3. In such a filter, the variation in parasitic inductances Lg1 and Lg2 vary the frequency of the attenuation pole Att, resulting in the variation in attenuation characteristic of the filter. Therefore, the inductors L2 and L3 are preferably provided.

As illustrated in FIG. 1, the capacitor C1 (a first capacitor) and the capacitor C2 (a second capacitor) are connected in series between the input terminal Tin and the output terminal Tout, and the capacitor C3 (a capacitive element) is connected in parallel to the capacitors C1 and C2 between the input terminal Tin and the output terminal Tout. This structure allows the attenuation pole Att to be formed. When the node N1 and the capacitor C3 are connected not through the capacitor C1 or C2, a mere high-pass filter is formed, and the attenuation pole Att is not formed. Therefore, the node N1 is coupled to the capacitor C3 through the capacitors C1 and C2. In such a filter, the variation in parasitic inductances Lg1 and Lg2 varies the frequency of the attenuation pole Att, resulting in the variation in attenuation characteristic of the filter. Therefore, the inductors L2 and L3 are preferably provided.

In particular, as illustrated in FIG. 6A, when the inductors L1 to L3 and the capacitors C1 to C3 form the a first local minimum of the attenuation pole Att (a first attenuation pole) at a frequency lower than the passband Pass, the variation in parasitic inductances Lg1 and Lg2 varies the frequency of the attenuation pole Att, resulting in the variation in attenuation characteristic of the filter. Therefore, the inductors L2 and L3 are preferably provided.

As in FIG. 12 of the second variation of the first embodiment, the capacitive element is the acoustic wave resonator 30, the acoustic wave resonator 30 forms a second local minimum of the attenuation pole Att2 (a second attenuation pole) between the first local minimum of the attenuation pole Att1 and the passband Pass. In this case, the variation in parasitic inductances Lg1 and Lg2 varies the frequency of the attenuation pole Att1, resulting in the variation in attenuation characteristic of the filter. Thus, the inductors L2 and L3 are preferably provided.

As in the third variation of the first embodiment, the capacitor C3 (a third capacitor) may be connected in series with the inductor L1 between the nodes N1 and N2. Also in this case, the attenuation pole Att can be formed. Thus, the variation in parasitic inductances Lg1 and Lg2 varies the frequency of the attenuation pole Att, resulting in the variation in attenuation characteristic of the filter. Therefore, the inductors L2 and L3 are preferably provided.

As presented in FIG. 7B and FIG. 8B of the simulation 3, the inductance of the inductor L2 and the inductance of the inductor L3 are preferably substantially equal to each other. When the inductance of the inductor L2 differs from the inductance of the inductor L3, the smaller of the inductances of the inductors L2 and L3 is preferably equal to or greater than 0.1 times, more preferably equal to or greater than 0.3 times, further preferably equal to or greater than 0.5 times, yet further preferably equal to or greater than 0.8 times the larger of the inductances of the inductors L2 and L3.

As the inductances of the inductors L2 and L3 are increased, the inductors L2 and L3 become larger, and the filter becomes larger. From this point of view, the inductance of the inductor L1 is preferably greater than the larger of the inductances of the inductors L2 and L3, and is more preferably equal to or greater than 2 times, further preferably equal to or greater than 5 times the larger of the inductances of the inductors L2 and L3. When the ground terminal Tg is divided into the ground terminals Tg1 and Tg2, the inductances of the inductors L2 and L3 are finite values. The larger of the inductances of the inductors L2 and L3 is preferably equal to or greater than 0.01 times, more preferably equal to or greater than 0.05 times, further preferably equal to or greater than 0.1 times the inductance of the inductor L1.

As in the first variation of the first embodiment, a first end of the inductor L4 (a fourth inductor) is coupled to the node N2, and a second end of the inductor L4 is coupled to the ground terminal Tg3 (a third ground terminal). By increasing the number of the inductors connected in parallel between the node N2 and the ground terminal, the variation in filter characteristics due to the variation in parasitic inductance can be reduced.

FIG. 7B and FIG. 11 suggest that it is preferable that the inductances of the inductors L2 to L4 be substantially equal to each other. When the inductances of the inductors L2 to L4 differ, it is therefore preferable that the differences among the inductances of the inductors L2 to L4 be small. Thus, the smallest of the inductances of the inductors L2 to L4 is preferably equal to or greater than 0.1 times, more preferably equal to or greater than 0.3 times, further preferably equal to or greater than 0.5 times, yet further preferably equal to or greater than 0.8 times the largest of the inductances of the inductors L2 to L4.

As illustrated in FIG. 3A to FIG. 3F, in the multilayered body 10, the dielectric layers 11a to 11f are stacked, the inductors L1 to L3 are formed in the multilayered body 10, and the ground terminals Tg1 and Tg2 are formed on the same surface of the multilayered body 10. In such a structure, the parasitic inductance is more likely to vary depending on the bonding method of the terminals 14 and 22. Thus, the inductors L2 and L3 are preferably provided.

Second Embodiment

Figure 16:
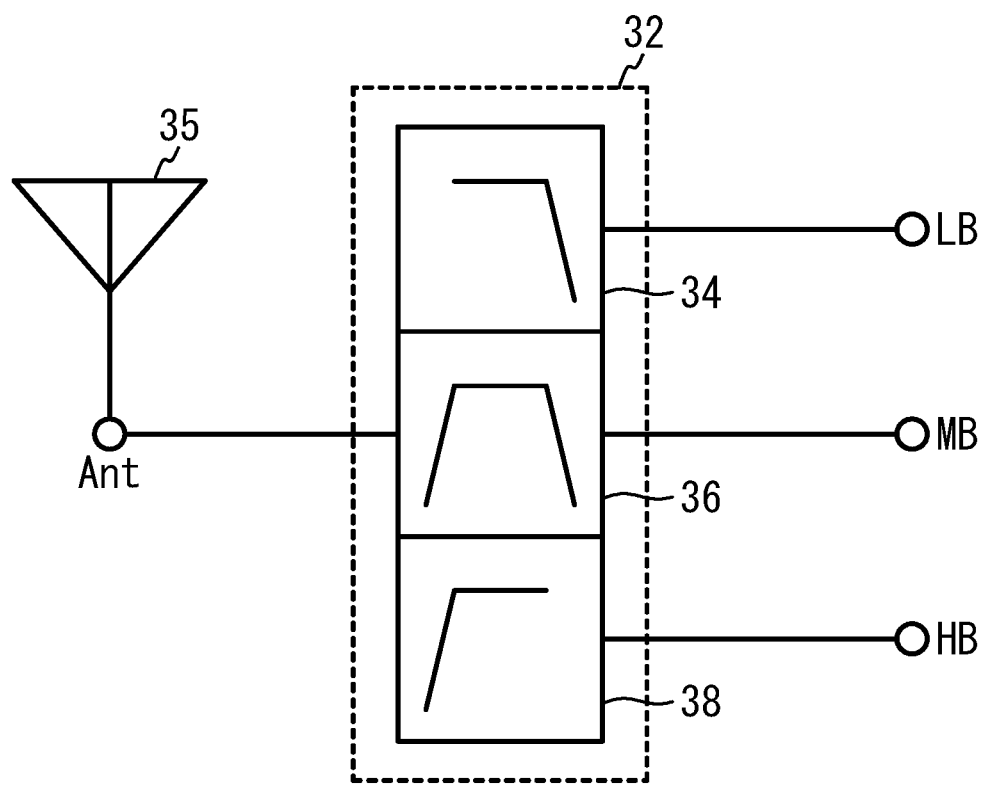
FIG. 16 is a circuit diagram of a triplexer in accordance with a second embodiment.

A second embodiment is an exemplary multiplexer in which the filter according to any one of the first embodiment and the variations of the first embodiment is used. FIG. 16 is a circuit diagram of a triplexer in accordance with the second embodiment. As illustrated in FIG. 16, a triplexer 32 includes filters 34, 36, and 38. The filter 34 is connected between a common terminal Ant and a terminal LB, the filter 36 is connected between the common terminal Ant and a terminal MB, and the filter 38 is connected between the common terminal Ant and a terminal HB. An antenna 35 is coupled to the common terminal Ant. The filter 34 is, for example, a low-pass filter, allows high-frequency signals in a low band to pass therethrough, and suppresses signals with other frequencies. The filter 36 is, for example, a bandpass filter, allows high-frequency signals in a middle band higher than the low band in frequency to pass therethrough, and suppresses signals with other frequencies. The filter 38 is, for example, a high-pass filter, allows high-frequency signals in a high band higher than the middle band in frequency to pass therethrough, and suppresses signals with other frequencies. The filter 38 may be the filter according to any one of the first embodiment and the variations of the first embodiment. A triplexer has been described as an example of the multiplexer, but the multiplexer may be a diplexer, a duplexer, or a quadplexer.

Although the embodiments of the present invention have been described in detail, it is to be understood that the various change, substitutions, and alterations could be made hereto without departing from the spirit and scope of the invention.

What is claimed is:

1. A filter comprising:
an input terminal;
an output terminal;
a first ground terminal;
a second ground terminal;
a first inductor having a first end coupled to a first node in a path between the input terminal and the output terminal and a second end coupled to a second node;
a second inductor having a first end coupled to the second node and a second end coupled to the first ground terminal; and
a third inductor having a first end coupled to the second node and a second end coupled to the second ground terminal,
wherein the first end of the second inductor is connected to the first node only through a path containing the first inductor, and the first end of the third inductor is connected to the first node only through a path containing the first inductor so that each of the second inductor and the third inductor is not connected to any one of the input terminal, the output terminal, and the first node through any path that does not contain the first inductor.

2. The filter according to claim 1, wherein the filter is a high-pass filter having a passband, and includes a resonant circuit that includes the first inductor, the second inductor, and the third inductor, and forms a local minimum of an attenuation pole at a frequency lower than the passband.

3. The filter according to claim 1, further comprising:
a first capacitor and a second capacitor that are connected in series between the input terminal and the output terminal; and
a capacitive element that is connected in parallel to the first capacitor and the second capacitor between the input terminal and the output terminal,
wherein the first node is a node between the first capacitor and the second capacitor, and is coupled to the capacitive element through the first capacitor and the second capacitor.

4. The filter according to claim 3,
wherein the filter is a high-pass filter having a passband, and
wherein the first inductor, the second inductor, the third inductor, the first capacitor, the second capacitor, and the capacitive element form a first local minimum of a first attenuation pole at a frequency lower than the passband.

5. The filter according to claim 4,
wherein the capacitive element is an acoustic wave resonator, and
wherein the acoustic wave resonator forms a second local minimum of a second attenuation pole between the first local minimum and the passband.

6. The filter according to claim 1, further comprising:
a first capacitor and a second capacitor that are connected in series between the input terminal and the output terminal; and
a third capacitor connected in series with the first inductor between the first node and the second node.

7. The filter according to claim 1, wherein an inductance of the second inductor and an inductance of the third inductor are substantially equal to each other.

8. A multiplexer comprising:
the filter according to claim 1.

9. The filter according to claim 1,
wherein no capacitor is connected between the second node and the second inductor and between the second node and the third inductor.

10. The filter according to claim 1, further comprising:
a third ground terminal; and
a fourth inductor having a first end coupled to the second node and a second end coupled to the third ground terminal.

11. The filter according to claim 1,
wherein the first inductor, the second inductor, and the third inductor are formed in a multilayered body in which dielectric layers are stacked, and
wherein the first ground terminal and the second ground terminal are formed on the same surface of the multilayered body.

12. A filter comprising:
an input terminal;
an output terminal;
a first ground terminal;
a second ground terminal;
a first inductor having a first end coupled to a first node in a path between the input terminal and the output terminal and a second end coupled to a second node;
a second inductor having a first end coupled to the second node and a second end coupled to the first ground terminal; and
a third inductor having a first end coupled to the second node and a second end coupled to the second ground terminal,
wherein a smaller of inductances of the second and third inductors is equal to or greater than 0.1 times a larger of the inductances of the second and third inductors.

13. A multiplexer comprising:
the filter according to claim 12.

14. A filter comprising:
an input terminal;
an output terminal;
a first ground terminal;
a second ground terminal;
a first inductor having a first end coupled to a first node in a path between the input terminal and the output terminal and a second end coupled to a second node;
a second inductor having a first end coupled to the second node and a second end coupled to the first ground terminal; and
a third inductor having a first end coupled to the second node and a second end coupled to the second ground terminal,
wherein an inductance of the first inductor is greater than a larger of inductances of the second and third inductors.

15. A multiplexer comprising:
the filter according to claim 14.

* * * * *